(12) United States Patent
Park

(10) Patent No.: US 7,316,945 B2
(45) Date of Patent: Jan. 8, 2008

(54) METHOD OF FABRICATING A FIN FIELD EFFECT TRANSISTOR IN A SEMICONDUCTOR DEVICE

(75) Inventor: Jeong-Ho Park, Seoul (KR)

(73) Assignee: Dongbu Hitek, Co., Ltd., Seoul (KR)

( * ) Notice: Subject to any disclaimer, the term of this patent is extended or adjusted under 35 U.S.C. 154(b) by 0 days.

(21) Appl. No.: 11/608,589

(22) Filed: Dec. 8, 2006

(65) Prior Publication Data

US 2007/0166891 A1    Jul. 19, 2007

(30) Foreign Application Priority Data

Dec. 29, 2005  (KR) .................. 10-2005-0134181

(51) Int. Cl.
*H01L 21/00* (2006.01)
*H01L 21/84* (2006.01)

(52) U.S. Cl. ................ 438/157; 438/283; 257/E21.051
(58) Field of Classification Search ................ 438/157, 438/176, 197, 283, 300; 257/E21.051
See application file for complete search history.

(56) References Cited

U.S. PATENT DOCUMENTS 6,946,377 B2 *  9/2005  Chambers .................. 438/588

* cited by examiner

*Primary Examiner*—Hoai v Pham
(74) *Attorney, Agent, or Firm*—Sherr & Nourse, PLLC

(57) ABSTRACT

A method for fabricating a fin FET in a semiconductor device. The method includes sequentially depositing first and second insulation films on a semiconductor substrate, etching the first and second insulation films using a first mask to form a trench, and depositing a first conductor in the trench.

17 Claims, 4 Drawing Sheets

METHOD OF FABRICATING A FIN FIELD EFFECT TRANSISTOR IN A SEMICONDUCTOR DEVICE

The present application claims priority under 35 U.S.C. 119 and 35 U.S.C. 365 to Korean Patent Application No. 10-2005-0134181 (filed on Dec. 29, 2005), which is hereby incorporated by reference in its entirety.

BACKGROUND

Developments in information technology and communications, as well as popularization of computers have led to improvements in semiconductor devices. Larger scale integration of semiconductor devices has spurred research into various methods aimed at reducing the feature size of individual devices formed on a substrate while maximizing performance.

CMOS (complementary metal oxide semiconductor) is a technique that allows larger scale integration of field effect transistors (FET). However, the decreasing dimensions of the FET due to ever larger scale integration results in a decrease in performance or reliability of the devices. To ameliorate these problems, a "fin" FET design has been proposed, characterized by a vertical body structure shaped like a fish's dorsal fin.

Three-dimensional fin FETs may have structural variations, for example, DELTA (fully depleted lean-channel transistor) and GAA (gate all around). A DELTA structure has an active fin-shaped region where a channel is to be formed. The active fin-shaped region protrudes vertically and has a predetermined width. A gate electrode surrounds the vertically protruded channel portion. Thus, the height of the protruded portion becomes the width of the channel and the width of the protruded portion becomes the thickness of the channel. Since both sides of the protruded portion function as a channel, the structure may have the effect of doubling the width of the channel. Accordingly, it is possible to prevent the effective channel width from being decreased while still reducing the overall size of the transistor. Further, since the channel depletion layers form on both sides, overlapping each other, channel conductivity may still be increased even when reducing the feature size of the device.

For instance, in a fin FET having a double gate structure, having the gate electrode at the top and bottom or left and right sides of the channel greatly enhances the current control characteristics in the channel. This means the leakage current between the source and drain can greatly be reduced compared with a single gate device, thereby improving DIBL (drain-induced barrier lowering) characteristics. In addition, the threshold voltage of the device may be varied dynamically by having gates at both sides of the channel. Therefore, the on-off characteristics of the channel may be greatly improved as compared to single gate structures, so that the short-channel effect may be suppressed.

However, the methods for fabricating a fin FET are complex and the current carrying performance is compromised due to further miniaturization of semiconductor devices.

SUMMARY

Embodiments relate to a method for fabricating a fin FET (field effect transistor) of a semiconductor device having a fin active region protruded from a silicon substrate.

Embodiments relate to a method for fabricating a fin FET which can simplify the fabrication process and maximize the current carrying performance of the FET by reducing the resistance of the source and drain regions. This may be accomplished with an increase in the area of the source and drain regions where salicide is to be formed.

Embodiments relate to a method for fabricating a fin FET (field effect transistor) by: sequentially depositing first and second insulation films on a semiconductor substrate; etching the first and second insulation films by using a first mask to form a trench on which a fin conductor is to be formed; depositing a first conductor on the first and the second insulation films on which the trench is formed, thereby forming a pin conductor; depositing a gate insulation film and a gate conductive layer on the first insulation film and the fin conductor; dry-etching the gate conductive layer by using a second mask to form a gate conductor; depositing a spacer film, forming a spacer on a side wall of the gate conductor by an overall etching method, and then forming a source and drain by a source and drain ion implantation process; and performing a salicide process on exposed portions of the formed gate conductor and fin conductor to form a salicide film.

BRIEF DESCRIPTION OF THE DRAWINGS

Example

DETAILED DESCRIPTION

Figure 1:
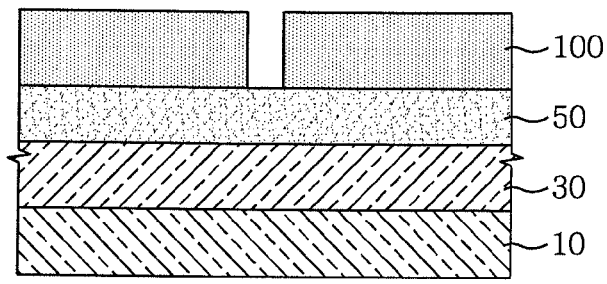
FIGS. 1 to 10 are cross-sectional views illustrating processes of fabricating a fin FET, in accordance with embodiments.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it may be directly on the other element or intervening elements may also be present. In contrast, when an element is referred to as being "directly on" another element, no intervening elements are present.

FIGS. 1 through 10 are cross-sectional views illustrating a series of processes of a method for fabricating a fin FET of a semiconductor device in accordance with embodiments. Referring to FIG. 1, a first insulation film 30 and a second insulation film 50 are sequentially deposited on the top of a semiconductor substrate 10. Then, a first photoresist is formed thereon and patterned to form a first photoresist pattern 100 by a development and exposure process to expose a region in which a fin conductor is to be formed. An oxide film may be used as the first insulation film 30. The thickness of the first insulation film 30 may range from about 1,000 Å to about 5,000 Å, although other ranges may be used as the person skilled in the art will appreciate. First insulation film 30 serves as a device isolation oxide film. A nitride film may be used as the second insulation film 50. The thickness of the second insulation film 50 may range from about 500 Å to about 3,000 Å, although other ranges may be used as the person skilled in the art will appreciate. A second insulation film 50 may adjust the height of a fin of the fin FET.

Figure 2:
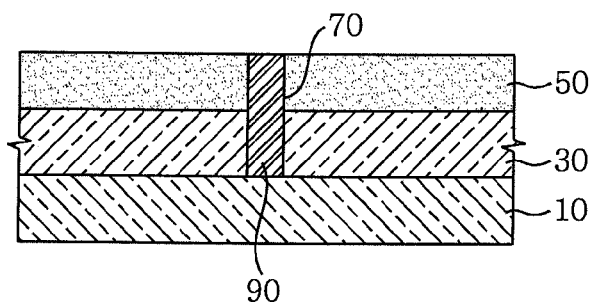

Thereafter, referring to FIG. 2, by using the first photoresist pattern 100 as a mask, the second insulation film 50 and the first insulation film 30 are etched to form a trench 70 where a fin conductor is to be formed, and then the first photoresist pattern 100 is removed. A dry-etching method is used for the above purpose.

Then, a first conductor is deposited and planarized by a CMP (chemical mechanical polishing) to form a fin conductor 90 filling the trench. The second insulation film is used as an etching stop layer in the CMP process. The first conductor is formed by using a CVD (chemical vapor deposition) or selective polysilicon deposition method.

Figure 3:
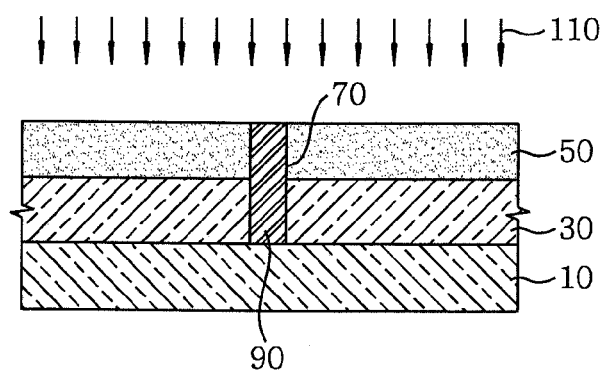
Figure 4:
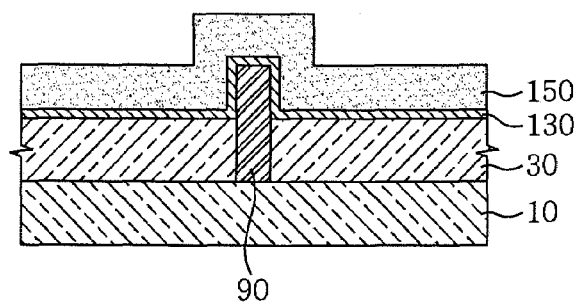

As illustrated in FIG. 3, a well implant and a Vt-adjust implant 110 are performed on the planarized substrate by an ion implantation process. As illustrated in FIG. 4, the second insulation film 50 is removed, and a gate insulation film 130 and a gate conductive layer are sequentially deposited on the resultant material. A phosphoric acid solution may be used for removal of the second insulation film 50. As the gate conductive layer, any one of polysilicon, TiN, Ti and TiN, and WxNy (i.e. compounds of tungsten and nitrogen) may be used. The gate insulation film may be formed by oxidation, PVD (physical vapor deposition), CVD, or ALD (atomic layer deposition). A second photoresist pattern (not shown) is formed on the top of the gate conductive layer, and used as a mask to perform dry etching, thereby forming a gate conductor 150. Then, the second photoresist pattern is removed.

Figure 5:
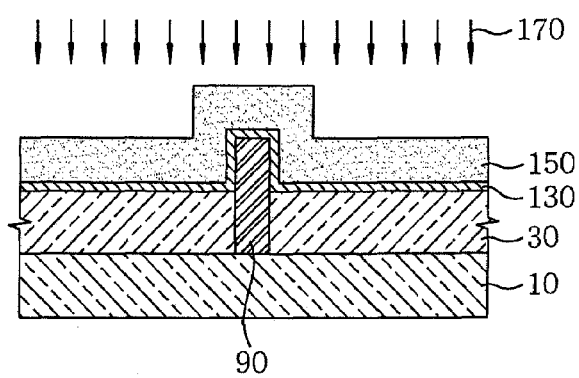
Figure 6:
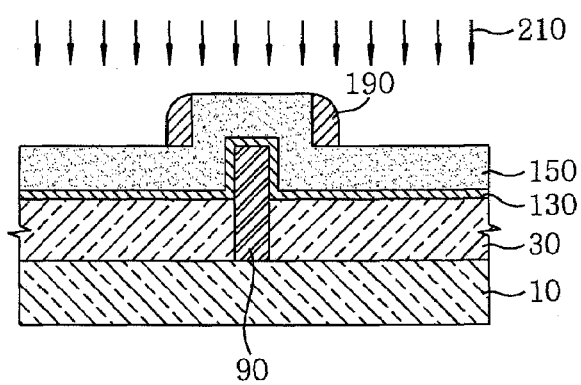

In succession, as shown in FIG. 5, a lightly doped ion implantation process 170 is performed to form an LDD implant region. Next, referring to FIG. 6, after the LDD implantation 170 is performed, a spacer film is deposited. Thereafter, a spacer 190 is formed by an overall etching method, and then, a source and drain is formed by a source and drain ion implantation process 210. The spacer 190 may include, for example, a nitride film or oxide film, or a mixed film thereof.

Figure 7:
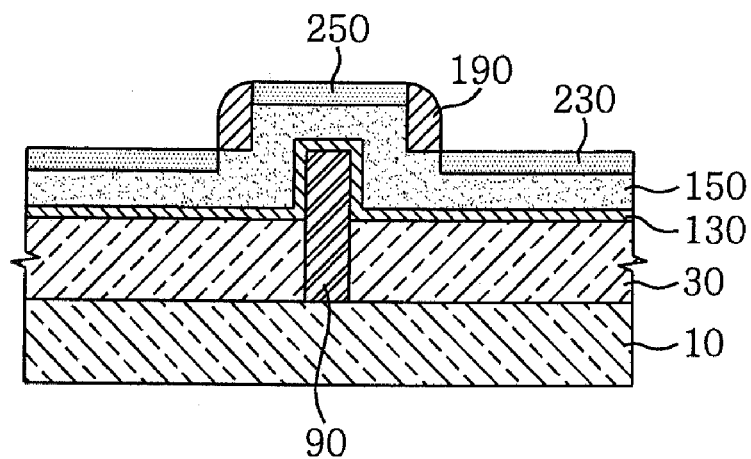

Then, as shown in FIG. 7, a salicide process for heat-treating exposed portions of the gate conductor 150 and the fin conductor 90 at a predetermined temperature is conducted to form a salicide film 230 and a gate salicide film 250. Such formation of the salicide film stabilizes the LDD region and the source and drain regions. Therefore, the salicide portion can be formed over a wide area, reducing the resistance of the transistor. The salicide film may be formed of any one of titanium-based salicide, cobalt-based salicide, or nickel-based salicide. The area of the salicide region is considerably increased in comparison with that of a salicide region of a conventional fin FET.

Figure 8:
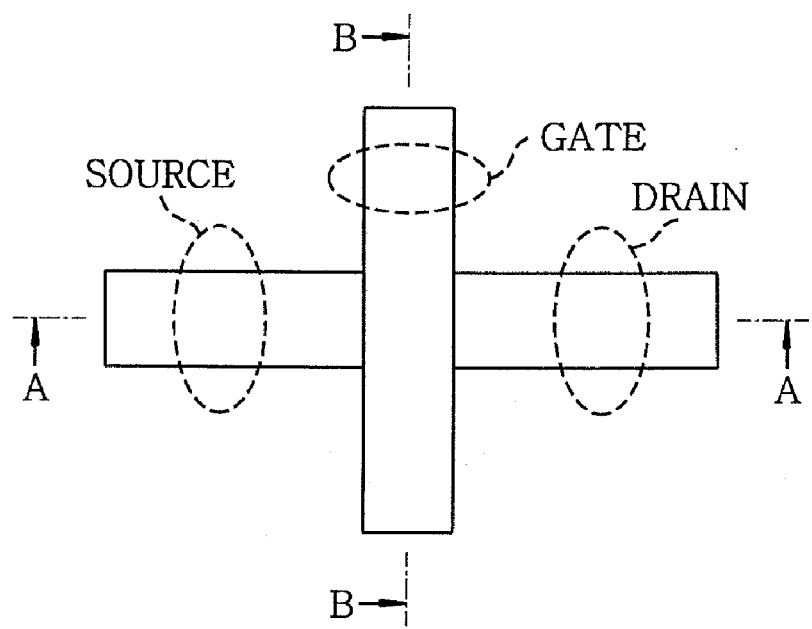
Figure 9:
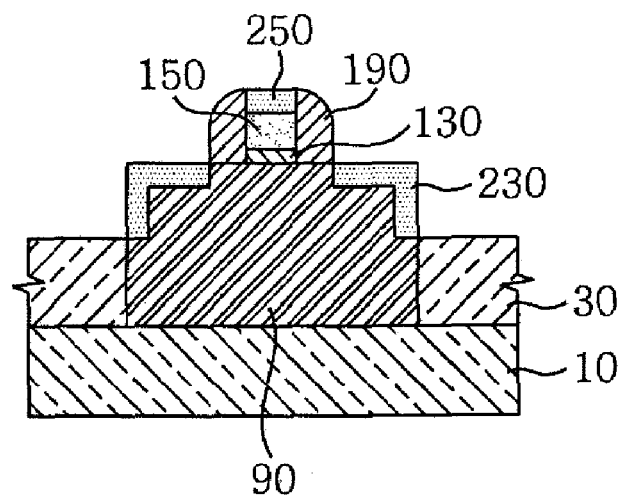
Figure 10:
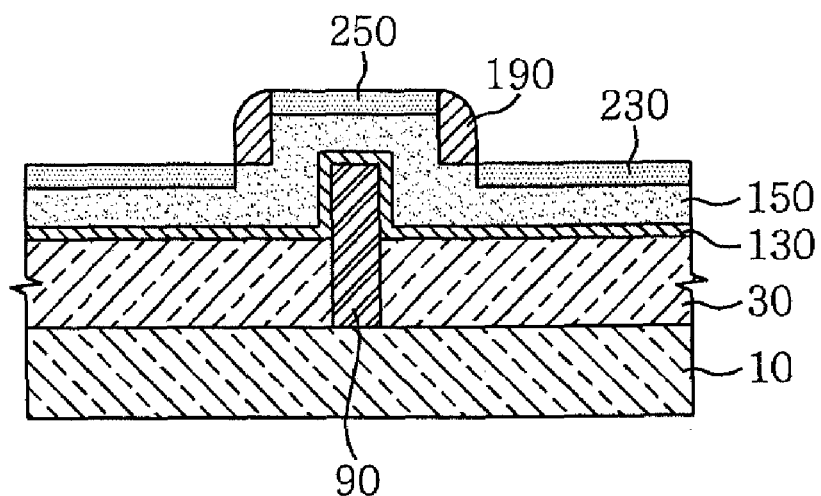

FIG. 8 is a view showing a top-view layout of a fin FET on which the source and drain ion implantation process 210 is performed. FIG. 9 is a view showing a cross-section taken along a line A-A of FIG. 8, and FIG. 10 is a view showing a cross-section taken along a line B-B of FIG. 8.

As set forth above, the embodiments simplify the process of forming a fin conductor by using a first insulation film and a second insulation film, and reduces the resistance of the source and drain regions by increasing the area of the region where salicide of the source and drain regions are to be formed, thereby maximizing the current performance of the transistor.

It will be apparent to those skilled in the art that various modifications and variations can be made to embodiments. Thus, it is intended that embodiments cover modifications and variations thereof within the scope of the appended claims.

What is claimed is:

1. A method for fabricating a fin field effect transistor comprising:

sequentially depositing a first insulation film and a second insulation film over a semiconductor substrate;

etching the first insulation film and the second insulation film using a first mask to form a trench on which a fin shaped conductor is to be formed; depositing a first conductor on the first and the second insulation films in which the trench is formed, thereby forming the fin shaped conductor;

depositing a gate insulation film and a gate conductive layer over the first insulation film and the fin conductor;

dry-etching the gate conductive layer using a second mask to form a gate conductor;

depositing a spacer film, forming a spacer on a side wall of the gate conductor by an overall etching method, and then forming a source and drain by a source and drain ion implantation process; and performing a salicide process on exposed portions of the gate conductor and fin conductor to form a salicide film.

2. The method of claim 1, wherein the first insulation film is an oxide film.

3. The method of claim 1, wherein a thickness of the first insulation film ranges from about 1,000 Å to about 5,000 Å.

4. The method of claim 1, wherein the first insulation film serves as a device isolation oxide film.

5. The method of claim 1, wherein the second insulation film is a nitride film.

6. The method of claim 1, wherein a thickness of the second insulation film ranges from about 500 Å to about 3,000 Å.

7. The method of claim 1, wherein the first and the second insulation films are dry-etched.

8. The method of claim 1, further comprising planarizing the deposited first conductor using chemical mechanical polishing to form the fin conductor after depositing the first conductor on the first and the second insulation films.

9. The method of claim 8, wherein the second insulation film is used as an etching stop layer in the chemical mechanical polishing process.

10. The method of claim 1, wherein the first conductor is formed by using at least one of chemical vapor deposition and selective polysilicon deposition.

11. The method of claim 1, wherein the second insulation film is removed using a phosphoric acid solution.

12. The method of claim 1, wherein the gate conductive layer includes one selected from a group including polysilicon, TiN, Ti and TiN, and compounds of tungsten and nitrogen (WxNy).

13. The method of claim 1, wherein the gate insulation film is formed by at least one of oxidation, physical vapor deposition, chemical vapor deposition, and atomic layer deposition.

14. The method of claim 1, wherein the spacer includes at least one of a nitride film and an oxide film.

15. The method of claim 1, wherein the spacer includes a mixed film of nitride and oxide.

16. The method of claim 1, further comprising the step of performing a well implant and a Vt-adjust implant by an ion implantation process on the planarized surface, before depositing the gate insulation film and the gate conductive layer.

17. The method of claim 1, further comprising carrying out a lightly doped ion implantation process on the substrate, in which the gate conductor is formed, to form a lightly doped drain implant region before depositing the spacer film.

* * * * *